United States Patent [19]
Lu

[11] Patent Number: 6,017,818
[45] Date of Patent: *Jan. 25, 2000

[54] PROCESS FOR FABRICATING CONFORMAL TI-SI-N AND TI-B-N BASED BARRIER FILMS WITH LOW DEFECT DENSITY

[75] Inventor: Jiong-Ping Lu, Dallas, Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/784,657

[22] Filed: Jan. 21, 1997

Related U.S. Application Data

[60] Provisional application No. 60/028,798, Oct. 31, 1996, and provisional application No. 60/010,405, Jan. 22, 1996.

[51] Int. Cl.$^7$ .............................. H01L 21/44; H01L 23/48
[52] U.S. Cl. ......................... 438/653; 438/656; 438/658; 438/660; 438/661; 438/680; 257/763; 257/751
[58] Field of Search .................................. 438/653, 656, 438/658, 660, 680, 661; 257/763, 751

[56] References Cited

U.S. PATENT DOCUMENTS

| | | | |
|---|---|---|---|
| 4,570,328 | 2/1986 | Price et al. | 29/571 |
| 5,252,518 | 10/1993 | Sandhu et al. | 437/200 |
| 5,378,660 | 1/1995 | Ngan et al. | 437/247 |
| 5,447,887 | 9/1995 | Filipiak et al. | 437/200 |
| 5,489,552 | 2/1996 | Merchant et al. | 437/192 |
| 5,585,300 | 12/1996 | Summerfelt | 437/60 |
| 5,612,558 | 3/1997 | Harshfield | 257/296 |
| 5,686,355 | 11/1997 | Sumi et al. | 437/192 |
| 5,723,382 | 3/1998 | Sandhu et al. | 438/653 |
| 5,736,192 | 4/1998 | Okamoto | 437/190 |

FOREIGN PATENT DOCUMENTS 2-246159  2/1990  Japan .

OTHER PUBLICATIONS

S. Reid et al, "Ti–Si–N Diffusion Barriers Between Silicon and Copper", IEEE Electron Device Letters, vol. 15, No. 8, pp. 298–300, Aug. 1994.

J. Ryan et al, "The Preparation and Characterization of Titanium Boride Films", Thin Solid Films, vol. 153, pp. 329–339, Dec. 1987.

*Primary Examiner*—John F. Niebling
*Assistant Examiner*—Ha Tran Nguyen
*Attorney, Agent, or Firm*—Mark A. Valetti; Carlton H. Hoel; Richard L. Donaldson

[57] ABSTRACT

A CVD process for Ti—Si—N or Ti—B—N films wherein a single feed gas (preferably TDMAT) serves as the source for titanium and nitrogen, and another feed gas is used as the source for silicon or boron. This avoids gas-phase particulate nucleation while providing good conformality. When the required thickness has been deposited, the silicon or boron feed gas continues to flow for some time after the titanium/nitrogen or titanium/boron source gas has been turned off. This results in a Ti—N film with a Si-rich or B-rich surface, which is conformal and has a low defect density. In a second embodiment, a single feed gas, such as TDMAT, is thermally decomposed to form a Ti—N layer. A post-deposition anneal is performed in a gas which supplies silicon or boron, incorporating these materials into the layer. The incorporation of silicon or boron into the layer minimizes the absorption of oxygen into the films, and therefore stabilizes the resulting films. The Si-rich or boron-rich surfaces are also helpful in wetting Al and enhancing adhesion to Cu, therefore are advantageous for advanced metallization application. Compared with the sputtering method, this invention offers a process for depositing films with much better step coverage and easier control of Si/Ti ratio. Compared with the TDEAT+NH$_3$+SiH$_4$ method, this invention eliminates the gas phase reaction between Ti source and NH$_3$.

12 Claims, 5 Drawing Sheets

SHEET OF FILMS PREPARED BY TWO DIFFERENT PROCESSES AS A FUNCTION OF AIR-EXPOSURE TIME

PROCESS FOR FABRICATING CONFORMAL TI-SI-N AND TI-B-N BASED BARRIER FILMS WITH LOW DEFECT DENSITY

This application claims benefit of Provisional application 66/028,798, Oct. 31, 1996. This application claims benefit of Provisional application 60/010,405 Jan. 22, 1996.

BACKGROUND AND SUMMARY OF THE INVENTION

The present invention relates to integrated circuit structures and fabrication methods.

Titanium nitride (TiN) is commonly used as a diffusion barrier in contacts, vias, and trenches and in interconnect stacks. It also may serve as a "glue layer" for chemical vapor deposited (CVD) tungsten and a nucleation layer for CVD tungsten and CVD aluminum. A good barrier layer should have: good step coverage to achieve void-free plug formation and adequate barrier thickness at the bottom of the contact/via/trench; good diffusion barrier properties to prevent diffusion of metals and $WF_6$ attack of the underlying metal or silicon during tungsten deposition; inertness and low reactivity with adjacent materials during thermal cycles; and acceptable electrical properties such as low resistivity, low contact/via resistance, and low junction leakage. In addition, the barrier layer should be as thin as possible so as to reduce the interconnect stack thickness.

Traditionally, reactively sputtered TiN and TiN formed by rapid thermal nitridation of titanium have been used as diffusion barriers. Presently, there is a trend to replace PVD TiN by CVD TiN to meet the step coverage requirements for sub 0.35 $\mu$m contacts, trenches, and vias. CVD TiN overcomes the metal reliability problems and the junction leakage issues associated with PVD TiN. CVD TiN can withstand thermal stresses of 550° C. while maintaining low contact resistance and leakage. In addition, CVD TiN is potentially a cleaner process than collimated PVD TiN.

CVD TiN deposited by reacting $TiCl_4$ with $NH_3$ has been utilized but has several problems. Some of these problems are: high deposition temperatures, chlorine incorporation as TiNCl, and formation of $NH_4Cl$ particles in the gas phase. While chlorine contamination can be reduced, it can not be eliminated using such a process. If the film must be deposited at a temperature lower than 400° C., the $TiCl_4/NH_3$ process can not be utilized but a metal-organic precursor may be used. Two commonly used metal-organic precursors are tetrakisdimethylaminotitanium (TDMAT) and tetrakisdiethylaminotitanium (TDEAT). Deposition of CVD TiN by the thermal decomposition of TDMAT results in a layer with good step coverage and low particle counts but results in unstable films with high resistivity. Resistivity can be improved by reacting the metal-organic precursor with ammonia. However, a reaction of TDMAT with $NH_3$ results in a film with poor step coverage and has potential problems associated with gas-phase reactions, such as particle formation.

The literature has discussed the possibility of using TDMAT or TDEAT without ammonia to deposit TiN, but teaches AWAY from this possibility: films deposited from TDEAT or TDMAT without ammonia are said to have very poor properties. See e.g. Sun and Tsai, "Characterization of low pressure chemical-vapor-deposited titanium nitride from metalorganic sources," in ESSDERC '94 PROCEEDINGS at pp.291–4, which is hereby incorporated by reference.

Ti—Si—N compounds provide an even better diffusion barrier than TiN, and hence are attractive for advanced metallization applications. Currently, two major methods are being explored for preparing Ti—Si—N based films; however, both have significant limitations. Reactive sputtering (of Ti—Si targets in an $N_2$ ambient) is the most established method, represented by extensive studies at Cal Tech. However, due to the directional nature of the sputtering method, the step coverage of deposited films is very poor for high aspect ratio contacts, vias, and trenches.

A chemical vapor deposition process using a mixture of silane, ammonia, and TDEAT is being investigated at Sandia National Lab. This method can provide films with better step coverage; however, the gas phase reaction between TDEAT and $NH_3$ results in particulate formation, and the films produced have high defect density.

Innovative Structures and Methods

The present application discloses innovative processes for fabricating conformal Ti—Si—N films with low defect density, which solves the problems encountered by both reported methods. These processes first deposit a porous barrier layer containing titanium and nitrogen, and thereafter perform a postdeposition treatment which introduces silicon into at least the upper surface of the porous layer, to provide a silicon-rich surface. (In an alternative embodiment, the postdeposition treatment introduces boron instead of or in addition to silicon.) The porous barrier layer preferably also includes a significant fraction of carbon, and optionally also includes a significant fraction of silicon before the postdeposition treatment.

Advantages of the disclosed methods and structures include:

The Si-rich surface of the Ti—Si—N film (or B-rich surface of Ti—B—N film) minimizes the absorption of oxygen into the films, and therefore stabilizes the resulting films.

The Si-rich or B-rich surfaces are also helpful in wetting Al and enhancing adhesion to Cu, and therefore are advantageous for advanced metallization application.

Compared with the sputtering method, this invention offers a process for depositing films with much better step coverage and easier control of Si/Ti ratio.

Compared with the $TDEAT+NH_3+SiH_4$ method, this invention eliminates the gas phase reaction between Ti source and $NH_3$.

The disclosed process is capable of providing conformal films with low defect density.

The disclosed process is flexible in controlling chemical composition, including surface composition.

The disclosed process can be performed in commercial CVD reactors and can be easily implemented.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 3a shows the atomic concentration of carbon, oxygen, nitrogen, titanium and silicon in films formed using prior art method. FIG. 3b shows the atomic concentration of carbon, oxygen, nitrogen, titanium and silicon in films formed using the method of the instant invention.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
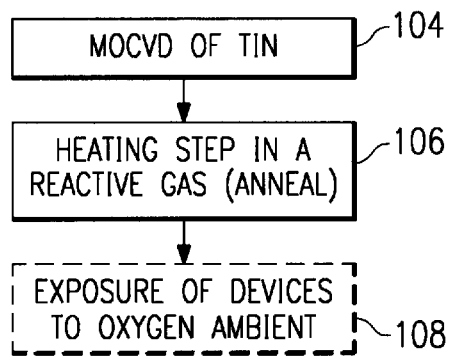
FIG. 1 is a flow diagram illustrating one embodiment of the instant invention.

FIG. 1 is a flow diagram illustrating the process flow of one embodiment of the instant invention. Fabrication of devices utilizing the instant invention starts off as does processing of most devices. In fact, standard processing can be utilized for all of the process steps up to the formation of the interlevel dielectric and the formation of the trenches or holes for the vias/contacts. Furthermore, standard processing can additionally be utilized after the formation of the TiN-based layer and the inventive annealing process step(s) of the instant invention. The process of the instant invention starts off by performing a metal-organic chemical vapor deposition (MOCVD) so as to form a titanium nitride film (step 104). This film is formed on the interlevel dielectric, on the side walls of the trench or hole, and at the bottom of the trench or hole and other places where conventional TiN have been used. Preferably, step 104 is achieved by thermal decomposition of TDMAT, $[(CH_3)_2N]_4Ti$. TDMAT is a liquid and is preferably introduced into the reactor using a carrier gas, such as He or $N_2$. The decomposition is preferably achieved within a temperature range of 300 to 500° C. and at a pressure between 0.1 to 50 torr. The deposition time is varied based on the desired thickness of the film. In an alternate embodiment, $C_2H_5$ can be used in place of $CH_3$ so that the precursor would be $[(C_2H_5)_2N]_4Ti$. In another embodiment, the precursor would preferably be $[(CH_3)(C_2H_5)N]_4Ti$.

Still referring to step 104, the wafer is heated as it is exposed to the precursor such that the precursor is thermally decomposed as a film deposited on the wafer. The resultant film is comprised of:

Ti—N—C which is a porous material and which readily absorbs $O_2$. Absorption of $O_2$ renders this film highly resistive and very unstable. More specifically, the resistivity of the film greatly increases as the film is exposed to air, which contains oxygen (see plot 202 of FIG. 2).

Next, a heating step is performed, step 106. This step is preferably performed in either a pure or diluted silane ambient, a disilane ambient, a $B_2H_6$ ambient, or any other ambients that can produce silicon or boron in the film. Preferably, this step is performed at approximately 350 to 500° C. at 0.1 to 50 torr for approximately 15 to 240 seconds. Anneal step 106 may be performed in the same reactor as deposition step 104 or it may be performed in a parallel reactor. If it is performed in the same reactor, the temperatures used in both MOCVD step 104 and anneal step 106 are preferably approximately the same. If the two steps are performed in separate but parallel reactors, the films formed in step 104 should not be subjected to oxygen prior to step 106. After step 106 is completed, the film is comprised of:

Ti—N—C—Si, when a Si-containing gas is used;

Ti—N—C—B, when a B-containing gas is used.

Figure 3A:
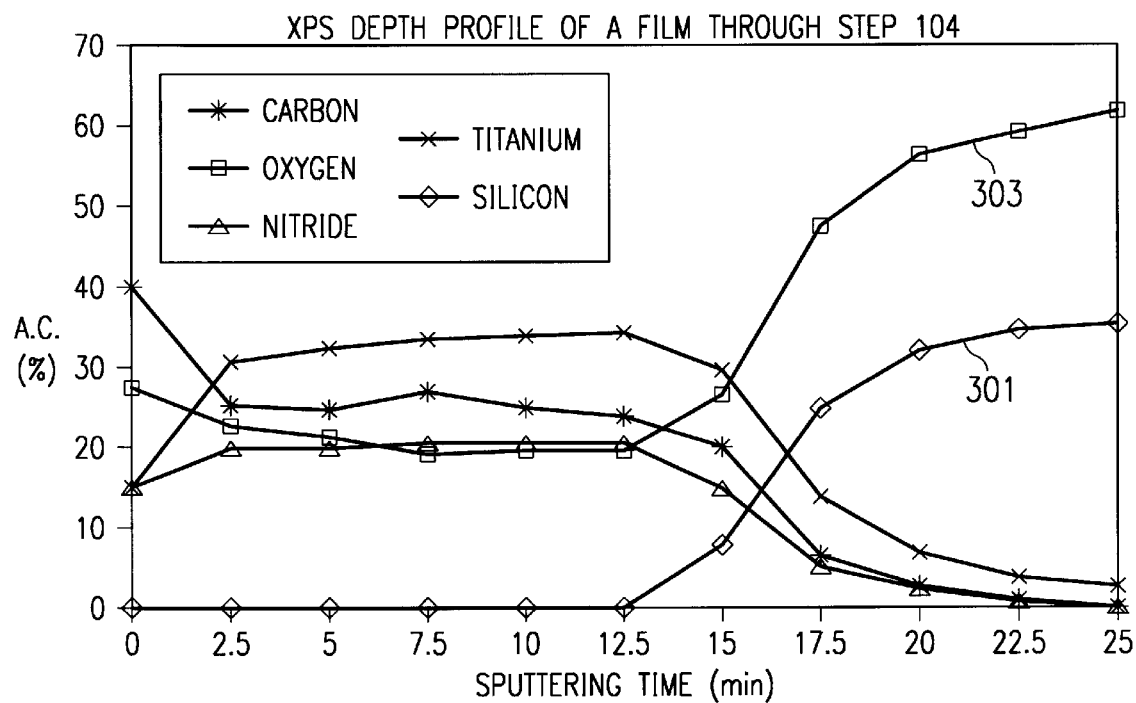
FIGS. 3a and 3b are graphs illustrating data taken from an X-ray photoelectron spectroscopy (XPS) depth profile analysis.
Figure 3B:
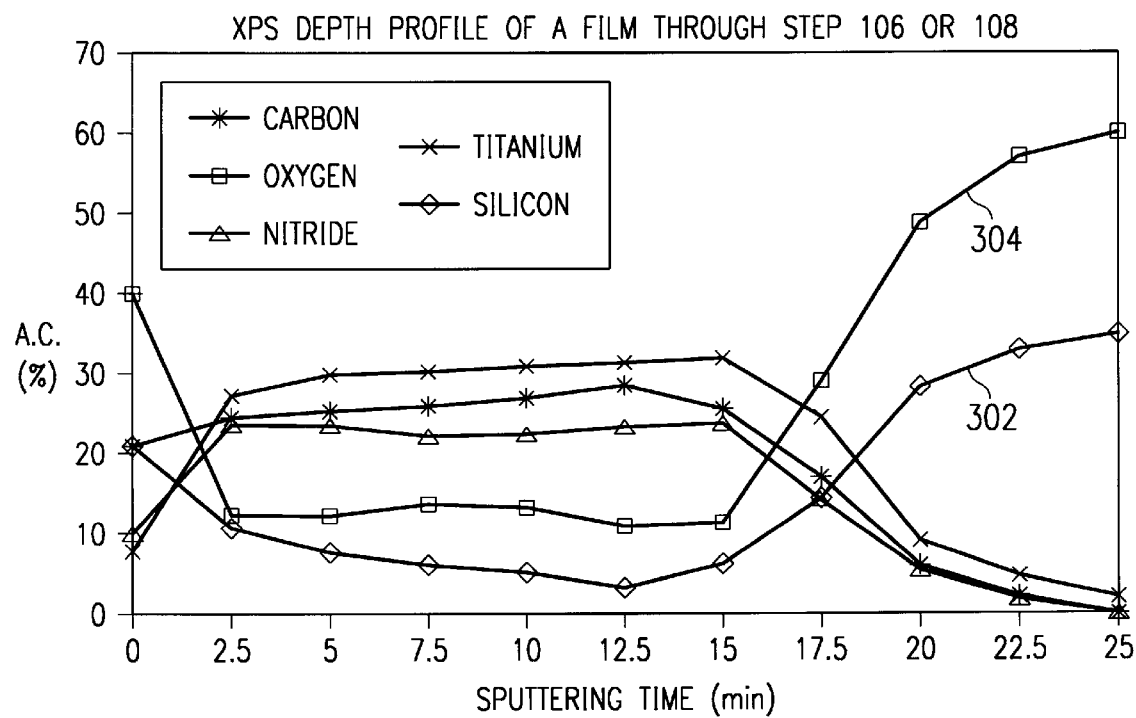

The inclusion of Si in the film can be seen in plot 302 of FIG. 3b.

After step 106 is performed, the wafer can either be further processed or subjected to an oxygen ambient (step 108) and then further processed. If step 108 is performed, oxygen is absorbed into the film such that the film comprises:

Ti—N—C—Si—O, when a Si-containing gas is used;

Ti—N—C—B—O, when a B-containing gas is used.

However, if the wafer is not exposed to an oxygen ambient then oxygen will not be absorbed.

While the above specifically refers to the formation of titanium-based barrier films, other transition metals may be used instead of titanium. More specifically, tungsten, tantalum, or molybdenum could be used instead of titanium in the formation of the barrier layer of the instant invention.

Figure 2:
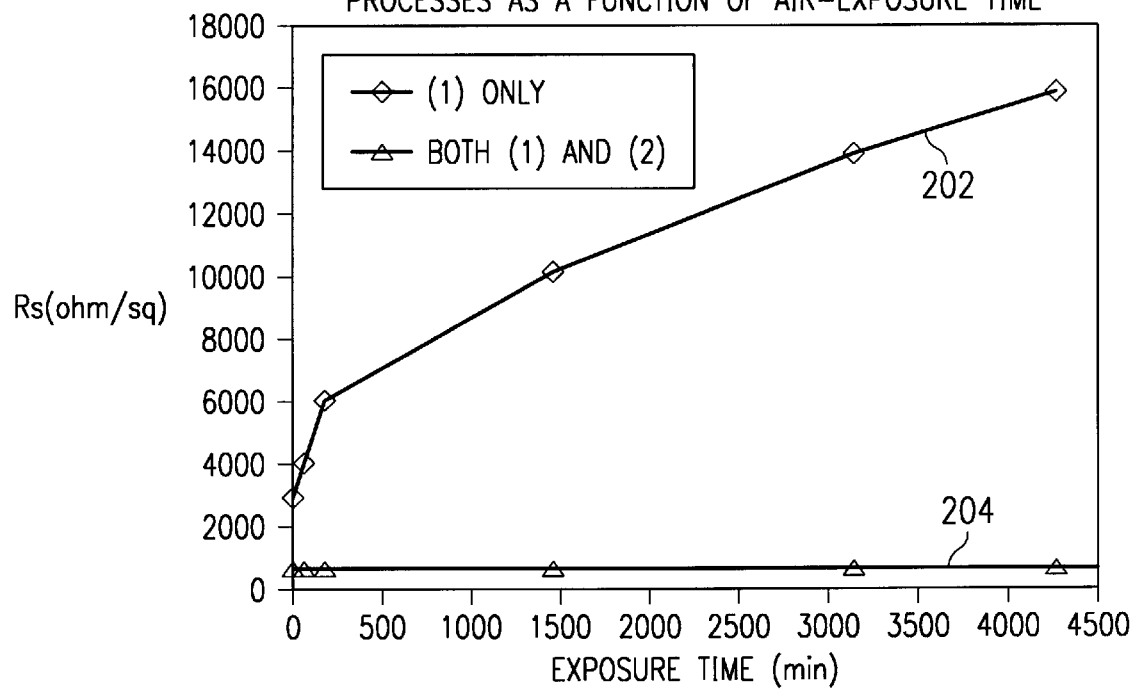
FIG. 2 is a graph illustrating sheet resistance (as a function of air-exposure time) of films formed using prior art methods of forming the film and films formed utilizing an embodiment of the instant invention.

FIG. 2 illustrates the sheet resistance, Rs, of two different films. The x-axis on FIG. 2 represents the amount of time, in minutes, that the films were exposed to air, and the y-axis represents the sheet resistance, in ohms/square, of the films. Films prepared without subjecting the film to step 106 have high sheet resistance. This is shown as plot 202 in FIG. 2. In addition, as can be seen in plot 202, the sheet resistance of the film formed without subjecting the film to step 106 increases significantly after exposing the film to oxygen. However, after performing step 106 the sheet resistance is reduced (as compared to plot 202) by an order of magnitude and is much more stable in air. This can be seen in plot 204.

Further experimental data has given the following comparison of sheet resistance of 20 nm films. Variables in these three runs include the silane treatment time, the use or lack of rapid thermal annealing ("RTA"), and various temperature levels.

| Sheet Resistance of 20 nm films | | | |
| --- | --- | --- | --- |
| Silane Treatment Time (sec) | 30 | 75 | 120 |
| Sheet Resistance without RTA (ohm/sq) | 1661 | 1361 | 1224 |
| 700C., 60 sec | 1510 | 1194 | 1072 |
| 800C., 60 sec | 1245 | 976 | 963 |

FIGS. 3a and 3b are XPS depth profiles which illustrate the level of carbon, oxygen, nitrogen, titanium, and silicon at various depths. The x-axis for each of these figures corresponds to depth. Greater sputtering time represents greater depth. The y-axis for both of these figures represents the atomic concentration (A. C.) in percentage of the total. Plot 302 of FIG. 3b illustrates that films that were subjected to step 106 contain silicon, while films that were not subjected to step 106 do not contain silicon (In plot 301 of FIG. 3a, the film's top surface would be at 0 min and the bottom is represented by approximately 16 minutes). The incorporation of silicon is critical for reduced uptake of oxygen from air, thereby resulting in reduced resistivity and increased stability. The incorporation of silicon or boron is beneficial when followed by Cu or Al metallization processes.

Plot 304 of FIG. 3b illustrates the limited oxygen absorbed into the film after subjecting the film to steps 106 and 108.

Figure 4:
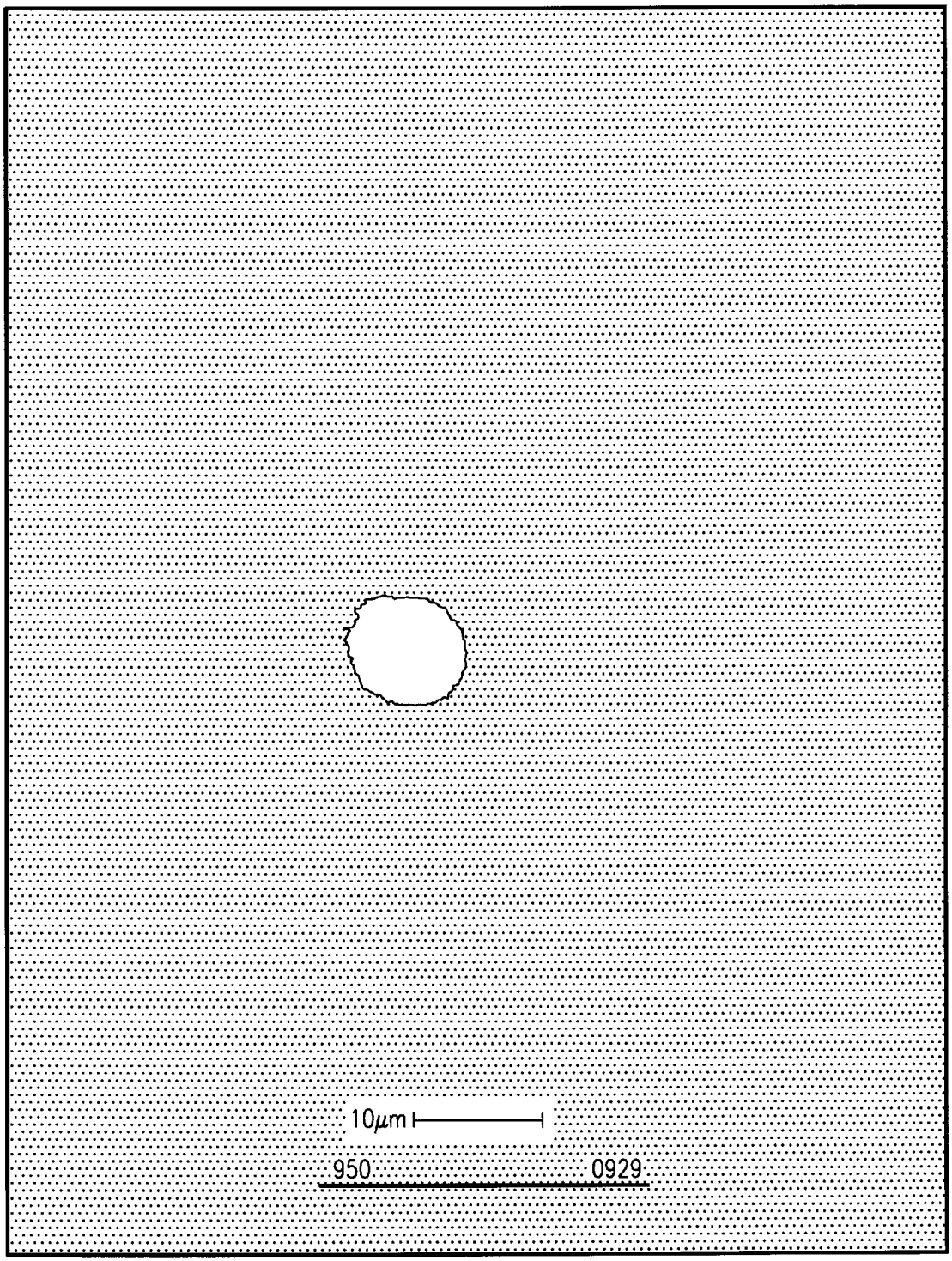
FIG. 4 is a transmission electron diffraction pattern of a film formed using the method of the instant invention.

FIG. 4 is a transmission electron diffraction (TEM) pattern. FIG. 4 illustrates that films subjected to step 106 (and 108) are amorphous. Amorphous films are preferred for barrier applications (as opposed to polycrystalline films), because metal diffusion occurs faster through grain boundaries in polycrystalline structures.

Figure 5:
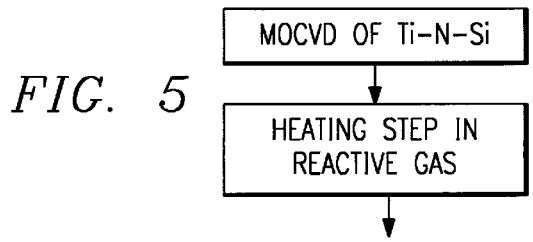
FIG. 5 is a flow diagram illustrating a second embodiment of the instant invention.

FIG. 5 is a flow diagram of a second embodiment of the innovative method. This process is similar to the process of FIG. 1, except that silane gas is added to the MOCVD step. This allows more silicon to be incorporated into the layer and facilitates a better adjustment of the Si/Ti ratio.

Figure 6:
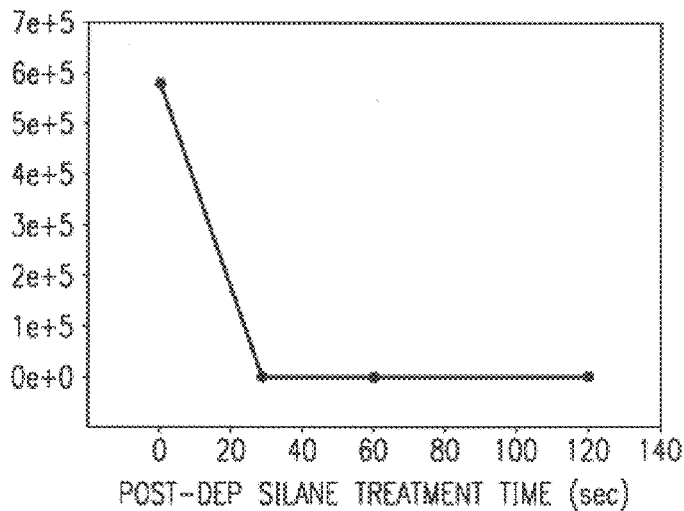
FIG. 6 is a graph showing the relationship between the sheet resistance of the deposited Ti—Si—N and the post-deposition silane anneal time.

FIG. 6 is a graph showing the relationship between the sheet resistance of the deposited Ti—Si—N and the post-deposition silane anneal time. This resistance was measured after two days exposure in air. It can be clearly seen that the sheet resistance drops dramatically after approximately 30 seconds annealing in silane.

Figure 7:
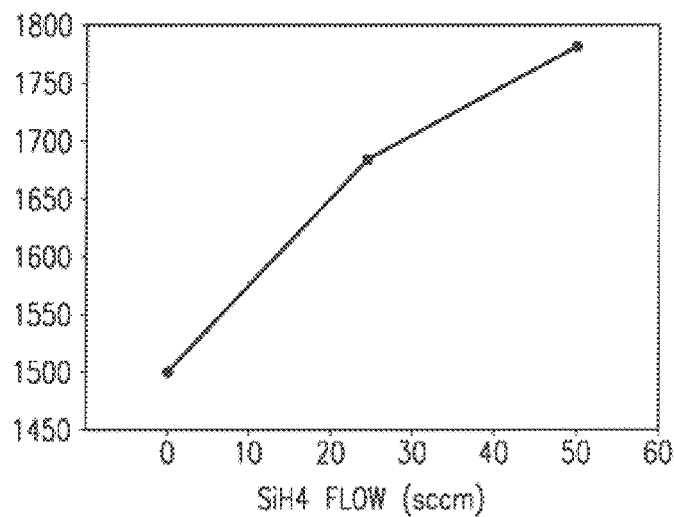
FIG. 7 is a graph showing the relationship between the sheet resistance of the deposited Ti—Si—N and the amount of silane flow during the deposition of Ti—Si—N.

FIG. 7 is a graph showing the relationship between the sheet resistance of the deposited Ti—Si—N and the amount of silane flow during the deposition of Ti—Si—N, when measured two days after exposure to air. As can be seen, higher flows of silane will increase the sheet resistance of the film, so the enhanced value as a barrier layer, which the inclusion of silicon provides, must be balanced by the higher resistance that the silicon produces.

Figure 8:
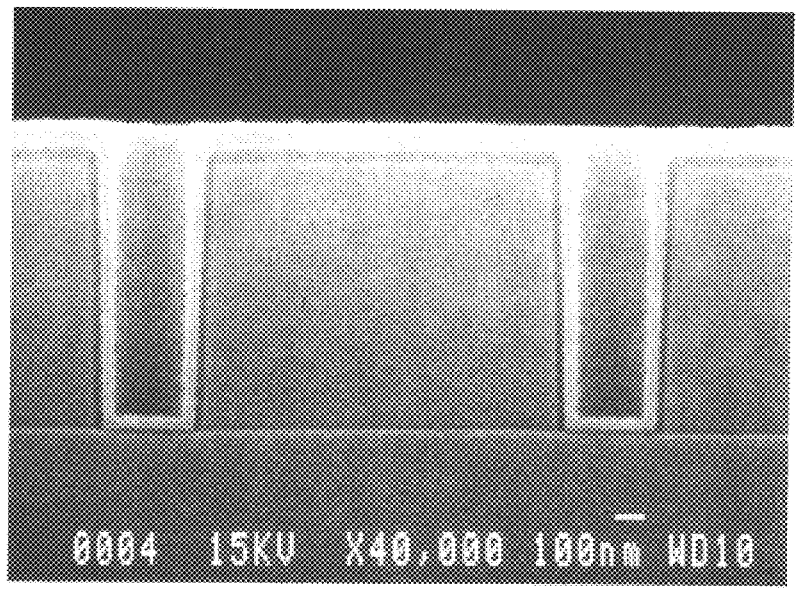
FIG. 8 shows a micrograph of a cross section through the innovative layer, showing that this method preserves the conformal nature of the layer.

FIG. 8 shows a micrograph of a cross section through the innovative layer, showing that this method preserves the conformal nature of the layer.

Further Sample Deposition Process Embodiment

One embodiment utilizes a first step in which TDMAT is thermally decomposed in the presence of nitrogen to provide a TiN layer. Immediately after deposition, the layer is exposed to an atmosphere of silane, which reacts with the layer so that silicon is incorporated into the layer and a silicon-rich surface layer is formed. The presence of silicon will inhibit the absorption of oxygen, which causes degradation of the layer.

The use of TDMAT as a precursor will also incorporate a high percentage of carbon into the layer. Surprisingly, carbon in the layer does not appear to be a problem; rather it reduces the stress in the layer and appears to have no effect on the lifetime of the circuit.

| Step 1: | |
| --- | --- |
| Ti Source Flow: | 70 sccm of TDMAT |
| Inert Source Flow: | 100 sccm of $N_2$ |
| Temp(Susceptor): | 460° C. |
| Total Pressure: | 1.2 Torr |

-continued

| Time: | 14 sec |
| --- | --- |
| Thickness: | 200Å |
| Step 2: | |
| Si Source Flow: | 500 sccm of $SiH_4$ |
| Temp (Susceptor) | 460° |
| Total Pressure: | 15 Torr |
| Time: | 60 sec |

Second Deposition Process Embodiment

One embodiment uses a first step which combines flows of $SiH_4$, TDMAT, and $N_2$ (as a diluent) to produce the barrier layer. After a sufficient depth is created, the TDMAT and $N_2$ are turned off, while the $SiH_4$ continues to flow for a measured amount of time. The embodiment shown is the presently preferred embodiment.

| Step 1: | |
| --- | --- |
| Ti Source Flow: | 100 sccm of TDMAT |
| Si Source Flow: | 25 sccm of $SiH_4$ |
| Inert Source Flow: | 100 sccm of $N_2$ |
| Temp (Susceptor): | 460° C. |
| Total Pressure: | 1.5 Torr |
| Time: | 60 sec |
| Composition: | amorphous Si—N and Ti—N—C |
| Step 2: | |
| Si Source Flow: | 450 sccm of $SiH_4$ |
| Total Pressure: | 15 Torr |
| Time: | 120 sec |

Third Deposition Process Embodiment $SiH_4$ can be replaced by other Si-source chemicals, such as $Si_2H_6$. In this embodiment, $Si_2H_6$ and TDMAT are flowed together with inert $N_2$ in the first step, followed by a second step, where the TDMAT and $N_2$ are turned off and a flow of $Si_2H_6$ incorporates extra silicon into the top of the layer.

Fourth Deposition Process Embodiment

TDMAT can be replaced by TMEAT, i.e. $Ti(NCH_3C_2H_5)_4$. For this embodiment, silane, TMEAT, and $N_2$ are flowed together for the first step. A second step of pure silane follows to incorporate additional silicon into the surface layer.

Fifth Deposition Process Embodiment

TDMAT can be replaced by TDEAT, i.e. $Ti(N(C_2H_5)_2)_4$. In this case, TDEAT and silane are flowed, together with $N_2$ or other inert diluent, to achieve deposition of a Si—N—Ti layer, followed by a step utilizing silane alone, to increase the concentration of silicon in the upper surface.

Sixth Deposition Process Embodiment

In this class of embodiments, a boron source is used, to produce a $Ti_xB_yN$ film. Thus a boron-source component (such as $B_2H_6$) is used instead of the Si-source component during deposition of the porous TiN film. In this example, TDEAT and diborane are flowed, together with $N_2$ or other diluent, to achieve deposition of a Ti—B—N layer, followed by a step utilizing diborane alone, to increase the concentration of boron in the upper surface.

Sample Metallization Embodiment

Figure 5A:
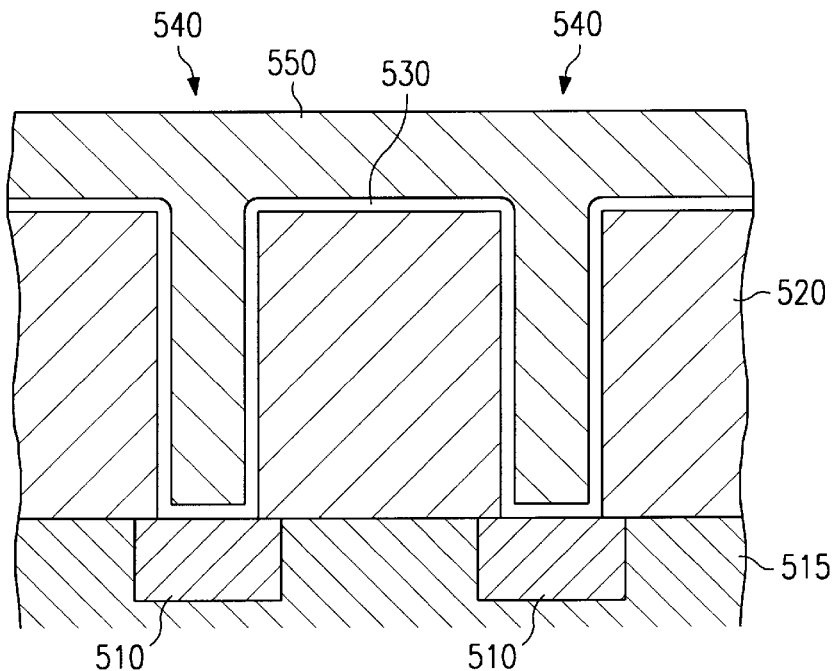
FIGS. 5A and 5B show an example of metallization over a barrier film layer deposited by the disclosed innovative process.

The innovative process disclosed herein can be utilized in metallization applications, particularly for copper (Cu) metallization. For example, in one application, as shown in FIG. 5A, a partially fabricated structure is provided which includes transistors, (not shown) beneath a conductor layer 510 (typically an aluminum alloy) which is surround by a lower interlevel dielectric 515. Thereafter, an upper interlevel dielectric 520 (e.g. BPSG over TEOS-deposited $SiO_2$)

is deposited and planarized by conventional methods (e.g. chemical-mechanical polishing, or "CMP"). Thereafter (in a process of the type referred to as a "damascene") the interlevel dielectric 520 is patterned and etched to form slots 530 where lines of metallization are desired, and also to form deeper holes 540 where vias are desired (i.e. where an electrical contact to the underlying conductor layer is desired). Thereafter a diffusion barrier layer 530 is deposited, using one of the processes described above. A highly conductive metal 550 (e.g. copper) is then deposited overall by conventional methods, and etched back overall (using e.g. CMP) so that the flat surface of the interlevel dielectric 520 is exposed wherever the metal 550 is not present.

Note that, in this embodiment, the barrier layer provided by the present invention runs over all exposed portions of the interlevel dielectric 520. That is, there are no locations where metal 550 comes directly in contact with the interlevel dielectric 520. This cuts down on the likelihood of copper atoms (or other lifetime killers such as gold) diffusing through an interlevel dielectric into the semiconductor substrate.

Second Sample Metallization Embodiment

Figure 5B:
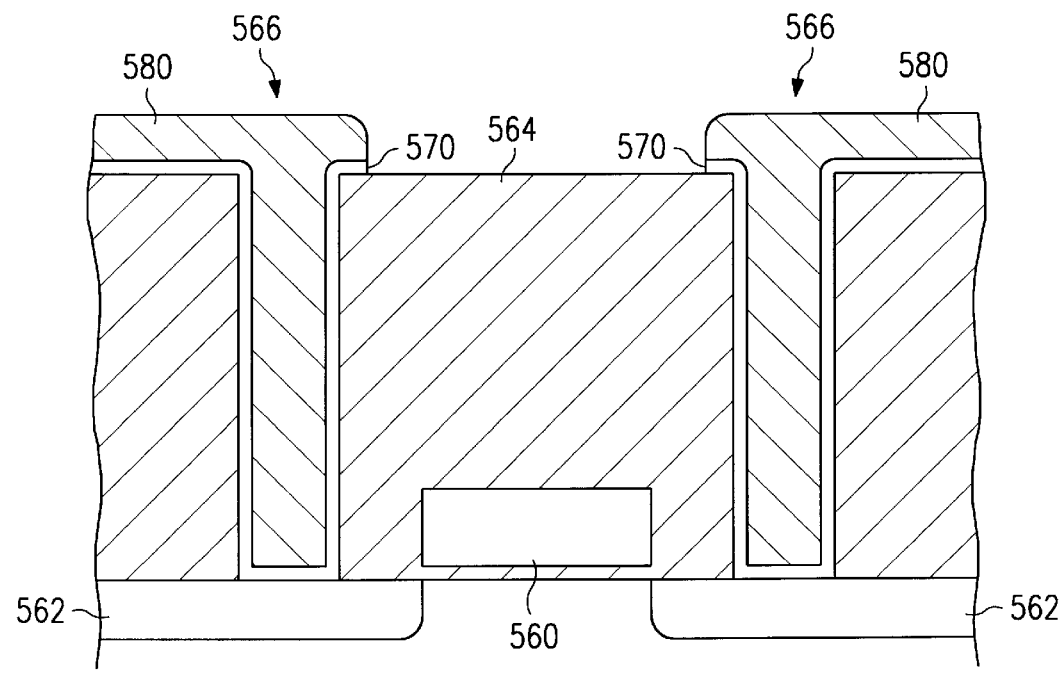

Another metallization embodiment, as shown in FIG. 5B, involves the formation of transistors with polycide gates 560 aligned to source/drain diffusions 562. A first interlevel dielectric layer 564 is subsequently formed. (Optionally, this is often followed by deposition and patterning of additional poly layers with corresponding additional interlevel dielectric layers, but these are not shown.) Contact locations 566 are patterned and etched prior to the deposition of the barrier layer 570 using the innovative processes disclosed herein. The metal layer 580 can then be deposited and patterned. In this sample embodiment, the metal layer 580 is an aluminum alloy, which is forced into the contact hole under superatmospheric pressure (using the "ForceFill™" process, in the presently preferred embodiment).

According to a disclosed class of innovative embodiments, there is provided: A method of forming a thin film, comprising the steps of: (a.) providing a substrate which includes at least one substantially monolithic body of semiconductor material; (b.) depositing a conformal layer by CVD in an atmosphere which includes titanium and nitrogen; (c.) after depositing said conformal layer, exposing said conformal layer to an atmosphere which contains silicon or boron; wherein said step (c.) produces a silicon- or boron-rich surface on said conformal layer.

According to another disclosed class of innovative embodiments, there is provided: An integrated circuit, comprising: a thin barrier layer film containing titanium and nitrogen; wherein said thin film has a graded composition of silicon or boron, with a greater concentration of silicon or boron at a first surface thereof.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

General background on CVD, and metallization is found in the following publications, which help to show the knowledge of those skilled in the art regarding variations and implementations: METALLIZATION AND METAL-SEMICONDUCTOR INTERFACES (ed. Batra 1989); VLSI METALLIZATION: PHYSICS AND TECHNOLOGIES (ed. Shenai 1991); Murarka, METALLIZATION THEORY AND PRACTICE FOR VLSI AND ULSI (1993); HANDBOOK OF MULTILEVEL METALLIZATION FOR INTEGRATED CIRCUITS (ed. Wilson et al. 1993); Rao, MULTILEVEL INTERCONNECT TECHNOLOGY (1993); CHEMICAL VAPOR DEPOSITION (ed. M. L. Hitchman 1993); and the semiannual conference proceedings of the Electrochemical Society on plasma processing; all of which are hereby incorporated by reference.

What is claimed is:

1. A method of forming a thin film, comprising the steps of:
   (a.) providing a substrate which includes at least one substantially monolithic body of semiconductor material;
   (b.) depositing a conformal layer by CVD in an atmosphere which includes titanium and nitrogen;
   (c.) after depositing said conformal layer, exposing said conformal layer to an atmosphere which contains silicon or boron at a temperature greater than or equal to 350 C. but less than 500 C.;
   wherein said step (c.) produces a silicon- or boron-rich surface on said conformal layer.

2. The method of claim 1, wherein said step (c.) follows immediately after step (b.), with no intervening steps.

3. The method of claim 1, wherein said step (b.) utilizes an atmosphere which includes silicon or boron.

4. The method of claim 3, wherein said step (b.) utilizes an atmosphere which includes $SiH_4$.

5. The method of claim 1, wherein said step (b.) utilizes an atmosphere which contains a titanium source component selected from the group consisting of TDMAT, TMEAT, and TDEAT.

6. The method of claim 1, further comprising the subsequent step of rapid thermal annealing.

7. A method of forming a barrier layer over a substrate and abutting a contact/via, said method comprising the steps of:
   providing a lower structure;
   forming a dielectric layer over said substrate;
   forming an opening in said substrate so as to expose at least a portion of said lower structure, said opening having side walls;
   forming a film suing a metal-organic precursor, said film formed on said dielectric layer, on said side walls of said opening, and on said exposed portion of said lower structure; and
   performing a heating step at a temperature greater than or equal to 350 C. but less than 500 C. in an active gas ambient such that silicon or boron is incorporated into said film.

8. The method of claim 7, wherein said metal-organic precursor is comprised of a material selected from the group consisting of: $[(CH_3)_2N]_4Ti$, and $[(C_2H_5)_2N]_4Ti$, and $[(CH_3)(C_2H_5)N]_4Ti$.

9. The method of claim 7, wherein said active gas is comprised of any gas which will incorporate silicon or boron in said metal-organic film.

10. The method of claim 7, wherein said active gas is selected from the group consisting of: silane, disilane, diborane, or any combination thereof.

11. The method of claim 7, wherein said lower structure is a substrate.

12. The method of claim 7, wherein said lower structure is a conductive layer.

* * * * *